(12) United States Patent
Frisch et al.

(10) Patent No.: US 6,963,131 B2
(45) Date of Patent: Nov. 8, 2005

(54) INTEGRATED CIRCUIT SYSTEM WITH A LATENT HEAT STORAGE MODULE

(75) Inventors: Michael Frisch, Munich (DE); Ralf Ehler, Budapest (HU)

(73) Assignee: Tyco Electronics AMP GmbH, Bensheim (DE)

( * ) Notice: Subject to any disclaimer, the term of this patent is extended or adjusted under 35 U.S.C. 154(b) by 5 days.

(21) Appl. No.: 10/692,543

(22) Filed: Oct. 24, 2003

(65) Prior Publication Data

US 2004/0145048 A1 Jul. 29, 2004

(30) Foreign Application Priority Data

Oct. 30, 2002 (DE) .......................... 102 50 604

(51) Int. Cl.[7] .................. H01L 23/42; H01L 23/043; H05K 7/14; F28D 17/00

(52) U.S. Cl. .................. 257/712; 257/713; 257/717; 257/714; 257/715; 257/716; 257/720; 257/721; 257/723; 257/722; 257/728; 257/724; 257/725; 257/729; 257/731; 257/E23.089; 428/307.3; 428/913; 428/319.1; 428/319.3; 165/10; 165/80.3; 62/3.2; 62/259.2; 62/3.7; 62/185; 62/435; 62/434; 62/439

(58) Field of Search .................. 257/712–717, 257/713, 728, 720–725, 729, 731, E23.089; 428/307.3, 913, 319.3; 165/10, 80.3; 62/3.2, 259.2, 3.7, 185, 434, 435, 439, 129, 59, 181

(56) References Cited

U.S. PATENT DOCUMENTS

| | | | |
|---|---|---|---|
| 4,057,101 A | 11/1977 | Ruka et al. | |
| 5,269,145 A | * 12/1993 | Krause et al. | ............... 60/659 |
| 5,381,859 A | 1/1995 | Minakami et al. | |
| 5,455,458 A | 10/1995 | Quon et al. | |
| 5,987,890 A | * 11/1999 | Chiu et al. | ............... 62/3.2 |
| 6,009,938 A | 1/2000 | Smith et al. | |
| 6,109,039 A | * 8/2000 | Hougham et al. | ............... 62/3.7 |
| 6,269,866 B1 | 8/2001 | Yamamoto et al. | |
| 6,668,567 B2 | * 12/2003 | Levenduski et al. | ............... 62/185 |
| 2002/0016505 A1 | * 2/2002 | Gally et al. | ............... 564/28 |
| 2002/0033247 A1 | * 3/2002 | Neuschutz et al. | ............... 165/10 |
| 2003/0203181 A1 | * 10/2003 | Ellsworth et al. | ............... 428/307.3 |
| 2003/0231928 A1 | * 12/2003 | Hildebrand et al. | ............... 404/17 |

FOREIGN PATENT DOCUMENTS

| | | |
|---|---|---|
| DE | 93 13 483.5 U1 | 1/1994 |
| EP | 0 402 304 A1 | 6/1990 |
| EP | 1 087 003 A2 | 9/2000 |
| JP | 59-35786 * | 2/1984 ............... 165/10 |
| JP | 4-101450 * | 4/1992 ............... 257/722 |

OTHER PUBLICATIONS

"Liquid Piston With Phase Change To Absorb Thermal Transients" IBM Technical Disclosure Bulletin, IBM Corporation, New York, U.S., vol. 38, No. 10 (Oct. 1995).

Bayerer, et al., "Leistungshalbleitermodule In Direkt–Bonding–Technik" 1155 Technische Rundschau, vol. 80, No. 32 (Aug. 5, 1988).

* cited by examiner

Primary Examiner—Alexander Oscar Williams
(74) Attorney, Agent, or Firm—Barley Snyder LLC

(57) ABSTRACT

The present invention relates to an integrated circuit system with at least one integrated circuit, a cooling body to dissipate the heat generated by the integrated circuit and a latent heat storage module having a latent heat storage medium. The latent heat storage module is thermally connected to the cooling body in order to temporarily store the heat generated by the integrated circuit and to convey it to the cooling body. The integrated circuit has at least one semiconductor component which is assembled on a substrate and the substrate is in direct thermal contact with the latent heat storage module.

10 Claims, 9 Drawing Sheets

INTEGRATED CIRCUIT SYSTEM WITH A LATENT HEAT STORAGE MODULE

RELATED APPLICATIONS

This application claims priority to DE Patent Application No. 10250604.3, filed Oct. 30, 2002.

FIELD OF THE INVENTION

The present invention relates to an integrated circuit system with a latent heat storage module thermally connected to a cooling body in order to temporarily store the heat generated by the integrated circuit and to convey it to the cooling body.

BACKGROUND

Integrated circuit systems are often operated for a short time or intermittently at a very high power. This is particularly true of power components for applications such as servo drives, soft starters, cranes and lifting or welding appliances. A cooling body is used to transfer the heat generated by high-powered operation out of the integrated circuit system. The cooling body used in high-powered operating conditions is typically dimensioned in such a way that the semiconductors in the integrated circuit system are not overheated even at peak load times. Furthermore, not only must the cooling bodies provide sufficient heat transfer to prevent exceeding the maximum dipole layer temperature, but the cooling bodies must ensured that the temperature does not increase to a temperature that would adversely effect the operating life of the integrated circuit. Accordingly, to prevent shortened operating life, the cooling body must be dimensioned even larger than would be required to transfer the heat during peak operation to maintain the maximum dipole layer temperature. However, in many applications, large cooling bodies lead to problems such as weight, structure size and material use.

For this reason, the short-duration peak dissipated energy is not conventionally carried outwards directly through a cooling body, but is temporarily stored in a heat accumulator. A metal base plate with of sufficient thickness is typically used as a heat accumulator in the case of so-called power modules. However, this has two disadvantages. First, the base plate is very heavy and expensive. Second, the thermal capacity of this type of heat accumulator depends upon the temperature increase.

However, it has been suggested that a latent heat accumulator, as is shown in U.S. Pat. No. 4,057,101, may provide the same thermal capacity as a base plate heat accumulator with a significantly lower weight. The suggested latent heat accumulator is based on the use of a meltable material as a latent heat storage medium. If a meltable material of this kind changes its state of aggregation from solid to liquid, this material absorbs a heat quantity which is referred to as fusion heat. This fusion heat is released if the latent heat storage medium solidifies again. Thus, a material with a high fusion heat may be used as a heat accumulator. If there are temperatures which are higher than the transitional temperature of the meltable material, the heat accumulator will maintain the transitional temperature until such time as the entire latent heat storage material has melted. Thus, a heat accumulator of this kind may provide protection against temporary overheating by the fact that excess heat is temporarily stored until such time as it may be carried away. Possible materials which may be used as latent heat storage media are shown in EP 0 402 304 A1 and in EP 1 087 003 A2, for example.

A further arrangement wherein a latent heat storage medium is used for the cooling of power semiconductor components is shown in U.S. Pat. No. 5,455,458.

The integrated circuit systems with latent heat storage described above, however, suffer from certain problems. The integrated circuit systems with latent heat storage, as described above, can not be economical manufactured. Also, the problem of optimal heat transmission between the semiconductor component generating the heat and the actual latent heat storage medium is not satisfactorily solved.

SUMMARY

Thus, the object of the present invention is to show an integrated circuit system and a latent heat storage module using the same, wherein the thermal contact of the integrated circuit to the latent heat storage medium is improved and, at the same time, efficient and economical manufacturability is ensured.

In an exemplary embodiment, the present invention provides an integrated circuit system with a latent heat storage module, wherein the thermal contact of the integrated circuit to the latent heat storage medium is improved and, at the same time, efficient and economical manufacturability is ensured. The invention is based on the basic principle of directly thermally coupling a substrate, on which a semiconductor component is assembled, to a latent heat storage module. The reliable temporary storage of peak dissipated energy thus achieved ensures that the semiconductor component is always operated in an optimal temperature range. Furthermore, the latent heat storage principle has a positive effect on the lifetime of the semiconductor component as, in contrast to a conventional heat accumulator, heat storage is performed only by a change in the state of aggregation without a temperature increase.

Direct thermal coupling of the substrate to the latent heat storage module reduces the thermal resistance between the semiconductor component and the latent heat storage medium, and therefore, reduces the risk of an excessively high temperature increase. If the material used for latent heat storage is selected so as to be suitable for the application, heat storage may occur almost without temperature increase, which leads to a significantly improved lifetime of the module. Furthermore, the entire arrangement may be highly miniaturised.

In an exemplary embodiment of the invention, the substrate may be formed by a DCB (direct copper bonding) substrate. A DCB substrate of this kind should be understood to be a ceramic substrate which is coated on two sides with copper and is directly mounted on the semiconductor components. Advantages of DCB substrates include: good mechanical stability, corrosion resistance and excellent electrical insulation combined with a very good thermal conductibility. DCB substrates exhibit good stability as regards thermal alternating cycles and, furthermore, have a thermal expansion coefficient which approaches that of silicon, so that no intermediate layers to the semiconductor component are required in order to compensate for differences in thermal expansion. Finally, structuring and processing are very simple.

A particularly simple possibility of coupling the substrate to the latent heat storage module is mechanical fixing using screws. However, other mechanical mounting methods such as riveting, locking or securing using spring clips may also be used.

Alternatively, joining processes such as welding, soldering and gluing have the advantage of an even lower thermal resistance.

According to one exemplary embodiment of the invention, the latent heat storage module has a latent heat storage housing which forms a hollow body filled with the latent heat storage medium. This design has the advantage that the latent heat storage module may be used economically for already available standard structures as supplied by various manufacturers.

According to an advantageous embodiment, a wall of the latent heat storage housing is at least partially formed by the substrate, being in thermal contact with the integrated circuit. As a result of this measure, a dividing wall obstructing the thermal transmission between the semiconductor component and the latent heat storage medium is not required. Here, the substrate is in direct contact with the latent heat storage medium and may convey the heat generated by the semiconductor component directly to the latent heat storage medium.

A substrate structure may be provided wherein the semiconductor component is assembled on a thermal coupling element which is embedded in an electrically insulating frame. This solution has the advantage that the superior thermal conductibility of an electric conductor may be used for direct heat dissipation from the semiconductor element into the latent heat storage medium. In comparison to a substrate manufactured as one piece from an electrically conductive material, this solution has the advantage of an electrically insulated design of the semiconductor elements in each case with a structure with a plurality of semiconductor elements as well as weight savings. Thermal coupling elements of this kind may be manufactured from copper by punching and bending, for example, but other structures and other manufacturing processes may also be used. In the case of assembly of a multiplicity of semiconductor components, electrical insulation of the semiconductor components from one another and with regard to the cooling body may therefore be achieved with simultaneous achievement of a high thermal capacity and thermal conduction.

A exemplary thermal coupling element of this kind may have a substantially U-shaped cross-section, the semiconductor component being assembled on the base and the two limbs being surrounded by the latent heat storage medium. "Cooling islands" designed in this way have the advantage of an optimal thermal connection to the latent heat storage medium and, at the same time, permit a straightforward assembly of the semiconductor component.

According to an advantageous embodiment, the thermal coupling element may simultaneously form the electrical bulk bonding of the semiconductor component (i.e. the electrical bonding of the semiconductor substrate). Using a thermal coupling element, embedded in the substrate, for both thermal coupling of the semiconductor component to the latent heat storage module and for electrical bulk bonding of the semiconductor component, simplifies assembly and ensures a safe electrical bonding. In this instance, different thermal coupling elements electrically insulated from one another may be provided in each case for semiconductor components with a different bulk potential.

According to a further advantageous embodiment, a wall of the latent heat storage housing, being in thermal contact with the cooling body, is at least partially formed by the cooling body itself. In this way, the latent heat storage medium is in direct thermal contact with the cooling body, and the heat stored in the latent heat storage module may be carried away into the environment yet more simply. In the alternative modular structure, the cooling body is attached to the latent heat storage module by soldering, gluing, welding or other mechanical connections.

In order to ensure a particularly rapid and efficient distribution of the stored heat in the volume of the latent heat storage medium, at least one heat-conducting rib may protrude into the interior volume of the hollow body of the latent heat storage module and be thermally connected to the latent heat storage housing. A rib of this kind may be formed in a particularly simple manner by a plate which is held on the latent heat storage housing in corresponding grooves.

Alternatively, the latent heat storage housing may be formed by strengthened peripheral regions of a multiplicity of heat-conducting ribs arranged substantially in parallel to one another and connected to one another. Ribs of this kind may be manufactured in a very simple manner by extrusion, for example. By stacking a variable number of ribs having the same profile, high flexibility with respect to the required size of the latent heat storage module may be achieved. If grooves and tongues are provided on the ribs, the individual ribs may be connected to one another in a particularly economical manner. Alternatively, however, other interlocking, non-positive or material-bonding, joining techniques may also be used.

A particularly good heat-conducting and temperature-resistant manner of connection is needed for the connection between the semiconductor component and the substrate. This may be either a soldered connection or a glued connection or else a press-fit connection.

Various materials whose transitional temperature lies in the temperature range which should not be exceeded during operation of the semiconductor component are suitable as latent heat storage media. A possible, economical and easily manageable material in this instance is paraffin.

The electrical connections which are required on the upper side of the semiconductor component may be made depending on the type of semiconductor component by means of conventional wire-bonding connections but also by means of joined connections and press-fit connections.

For an improved heat conveyance to the environment, the cooling body may have at least one cooling rib for dissipation of the heat. In order to keep the dimensions of the cooling body as small as possible, the cooling body may be designed in such a way that it is connectable to a cooling circuit. A cooling circuit of this kind may be realised by a fan or else by a liquid cooling circuit. In this way, the working temperature may be kept constant even during very long intermittent periods.

BRIEF DESCRIPTION OF THE DRAWINGS

The invention will be described in more detail hereinafter with reference to the embodiments shown in the accompanying drawings. Similar or corresponding details are provided with the same reference numerals in the figures, in which.

DETAILED DESCRIPTION

Figure 1:
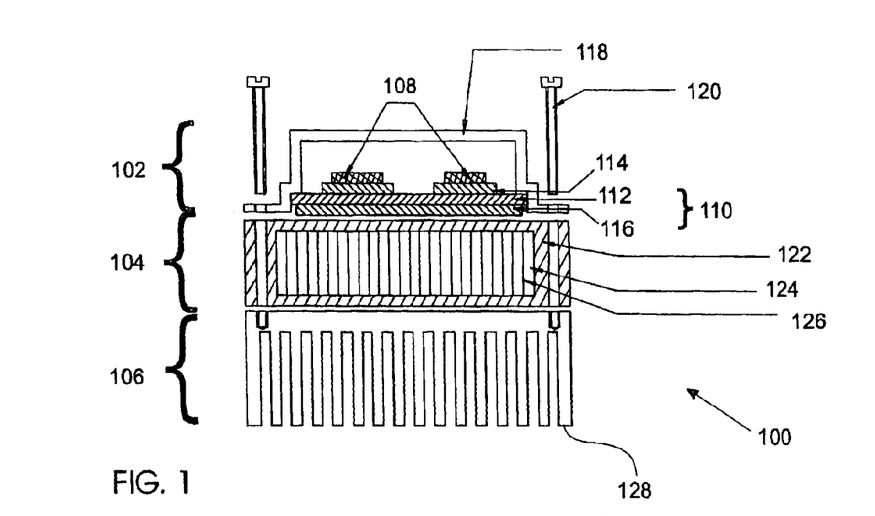
FIG. 1 is an exploded sectional view of an integrated circuit system according to an exemplary embodiment of the present invention.

FIG. 1 shows an exploded sectional view of an integrated circuit system 100 according to an exemplary embodiment of the present invention. The modular structure shown here comprises the integrated circuit 102, the latent heat storage module 104, and a cooling body 106. Here, the integrated circuit 102 has a plurality of semiconductor components 108 which are assembled on a substrate 110. In the present case, the substrata 110 is formed by a so-called DCB substrate (direct copper bonding), where copper layers 114, 116 are applied onto both sides of a ceramic layer 112. A plastic housing shell 118 protectively covers the semiconductor components 108, and allows assembly of the integrated circuit 102 on the latent heat storage module 104 via the screws 120. The latent heat storage module 104 is formed by a latent heat storage housing 122 which contains the actual latent heat storage medium 124.

This latent heat storage medium 124 may be paraffin, for example. However, other media, for example, salts dissolved in liquid or metal alloys with a low melting point are also possible. In the latent heat storage module, the energy required for changing the state of aggregation of the latent heat storage medium is used for energy storage. Because the energy required for the change of the state of aggregation corresponds to a temperature increase of from about 50° K. to about 100° K. with full utilisation of the thermal capacity of a typical cooling body material, depending on the material, a substantially higher amount of energy may be temporarily stored as a result of the latent heat storage principle than with the use of the thermal capacity of a cooling body material, for example of a copper plate. So that the heat to be temporarily stored may be conveyed to the latent heat storage medium 124 with as low a thermal resistance as possible, the substrate 110 of the integrated circuit 102 is in direct thermal contact with the latent heat storage module 140. Heat-conducting metal ribs 126 provide improved heat distribution to the latent heat storage medium. The conveyance of the temporarily stored heat to the environment is performed in the embodiment shown via a cooling body 106. The cooling body 106 corresponds to conventional metal cooling bodies and has the cooling ribs 128 required for an optimal heat conveyance. In the embodiment shown, the cooling body 106 may be configured in such a way that its heat conveyance is guided through a fan or other cooling circuit. Thus the working temperature may be kept constant even during very long intermittent periods.

The cooling body 106 may be designed in such a way that without fan operation, very little heat emission occurs and the fan ensures heat conveyance from the cooling body 106 only during operation of the integrated circuit system 100.

Although the embodiment illustrated in FIG. 1 shows the integrated circuit 102 connected to the latent heat storage module 104 by screws 120, other fastening means can also be used. For example, spring clips, rivets, catches and other mounting methods may also be used for connecting the integrated circuit to the latent heat storage module.

Figure 2:
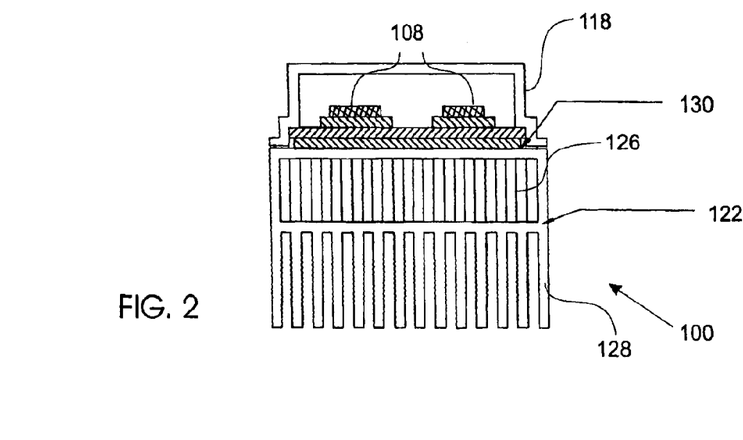
FIG. 2 is a sectional view of an integrated circuit system according to an alternative exemplary embodiment of the present invention.

In order to keep the thermal transmission resistances as low as possible, in addition to the modular solution shown in FIG. 1, a more complete integration of the components may also be provided. For example, FIG. 2 shows an embodiment wherein the substrate 110 is connected to the latent heat storage module 104 by a soldered connection or a glued connection 130. Accordingly, a welded or bonded connection may also be provided. In this instance, the cooling body 106 may also be fixed to the latent heat storage module 104 by soldering, gluing or welding. A further improved conveyance of temporarily stored heat to the cooling body may be achieved by the fact that the cooling body forms one wall of the latent heat storage housing 122. Accordingly, the latent heat storage module 104 and the cooling body 106 may thus be manufactured as an integrated component.

Figure 3:
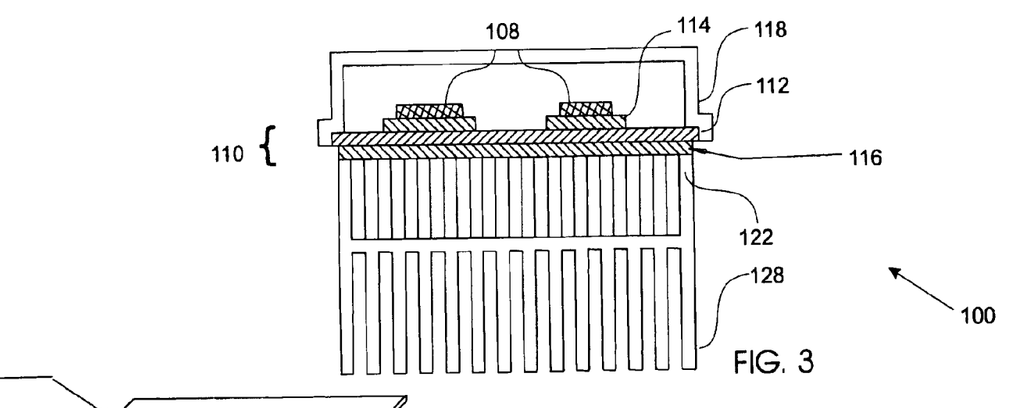
FIG. 3 is a sectional view of an integrated circuit system according to another alternative exemplary embodiment of the present invention.

As can be seen from the embodiment from FIG. 3, a further reduced thermal transmission resistance between the heat-generating semiconductor component 108 and the latent heat storage medium 124 may be achieved in that the substrate underside, in the case of a DCB substrate, the lower copper layer 116, directly forms one of the walls of the latent heat storage housing 122. This embodiment, wherein the lower copper layer 116 of the DCB substrate forms one unit with the latent heat storage housing 122, is a very good solution for upstream integrated circuits, as the load cycle values required for these applications may be achieved owing to the properties of DCB substrates. A plurality of semiconductor components 108 may be assembled on a substrate 110 insulated from one another. The upper copper layer 114 of the substrate 110 may, as in the case of a printed circuit, be structured for the electrical connection of the semiconductor components 108 and, as a result of the thick copper layer, a high current carrying capacity of the individual strip conductors may be achieved.

Figure 4:
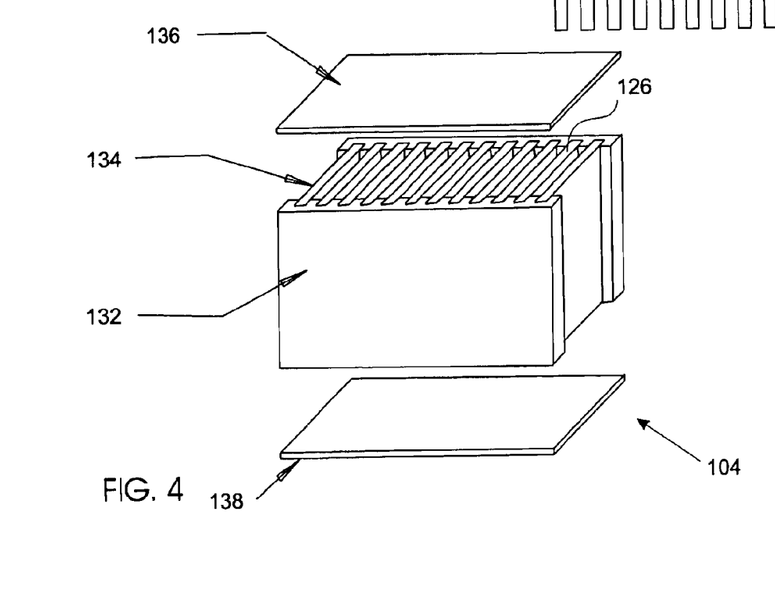
FIG. 4 a an exploded perspective view of a partially assembled latent heat storage module according to an exemplary embodiment of the present invention.

FIGS. 4 to 26 show different possibilities for realising the latent heat storage module 104 shown schematically in FIGS. 1 to 3. FIG. 4 shows an embodiment of the latent heat storage module 104 wherein the latent heat storage housing 122 is formed by various metal plates. The first metal plates 132 have grooves in which the second metal plates 134, which serve both as further housing walls and also as heat-conducting ribs 126, may be inserted. This body may be closed by ceiling and floor plates 136, 138 or else directly by the substrate 110 and the cooling body 106. Conductive plates comprising materials other than metal may also be used.

Figure 5:
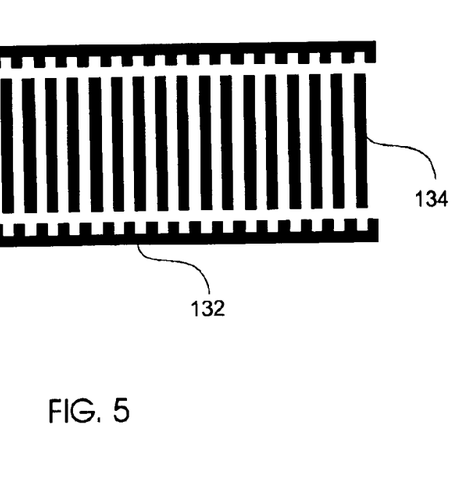
FIG. 5 a top view of the latent heat storage module from FIG. 4 with the ceiling plate and or substrate removed.

In FIG. 5, a top view of the latent heat storage module structure of FIG. 4 is shown, with the two first metal plates 132 shown before assembly with the second metal plates 134 to be inserted in the grooves formed in the first plates 132. The advantage of this structure lies in the particularly simple manufacturability of the individual components, such as extrusions for first plates 132 and a rolled plate for second plates 134. In this instance, the second metal plates 134 may be soldered in, pressed in, glued in or welded in. The plates 136 and 138 may also be glued, soldered, welded or else secured by non-material-uniting joining processes.

Figure 6:
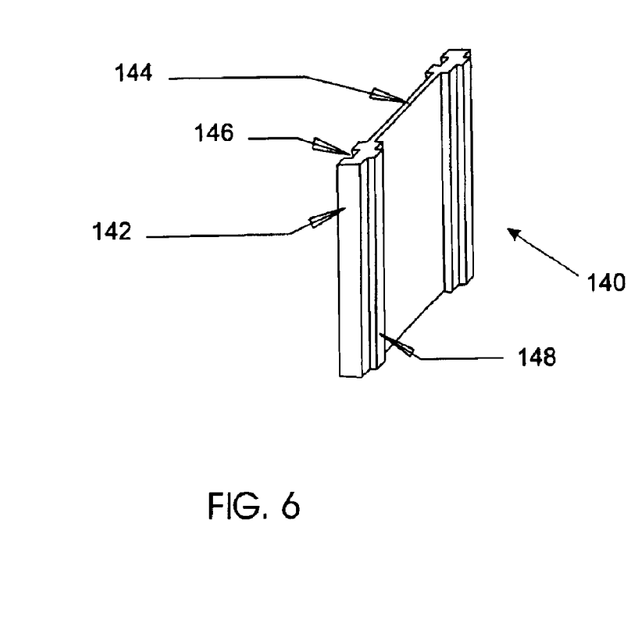
FIG. 6 a profile section of a latent heat storage module according to another exemplary embodiment of the present invention.
Figure 7:
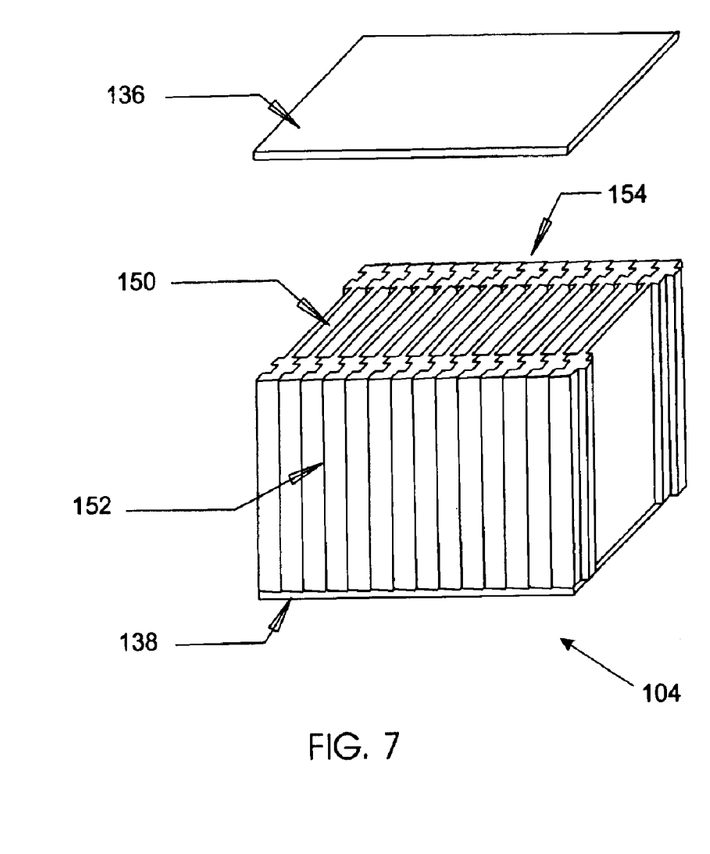
FIG. 7 is a perspective view of an exemplary latent heat storage module formed by profile sections as shown in FIG. 6.

According to a further exemplary embodiment of the invention storage module 104 may be manufactured by joining together a multiplicity of profile sections 140, as shown in FIG. 6. Profile section 140 has a peripheral region 142 in which a groove 146 and a tongue 148 are arranged in such a way that a multiplicity of profile sections 140 may be arranged in series, as shown in FIG. 7, in order to form a latent heat storage module 104. The middle region 144 of the profile section 140 thus forms either one of the heat-conducting ribs 126 or else a lateral wall of the latent heat storage housing 122. The profile section 140 may be manufactured by means of an extrusion process, for example. The connection of the individual profile sections 140 may be made by joining processes such as gluing or soldering, or else by a pure interlocking fit such as press-fitting. FIG. 7 also shows how, analogously to the embodiment of FIGS. 4 and 5, a ceiling plate 136 and a floor plate 138 close the latent heat storage housing 122. However, in this embodiment as in the modular embodiment, the substrate 110 and/or the cooling body 106 may directly enclose the latent heat storage medium (not shown in FIGS. 6 and 7), which is located in the intermediate areas 150.

Alternatively, the substrate 110 may be connected to the face 152 and, correspondingly, the cooling body 106 may be connected to the face 154 formed by the peripheral regions 142 of the profile sections 150.

Figure 8:
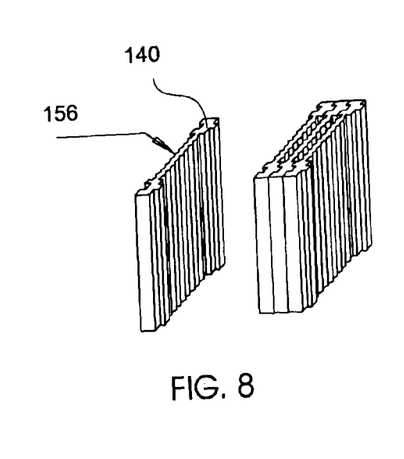
FIG. 8 is a perspective view of profile sections according to a further exemplary embodiment of the present invention.

To increase the heat-distributing area, the profile sections 140 may, as shown in FIG. 8, be provided with additional rib structures 156 in their middle region 144. In this instance, the configuration of the rib structure 156 may also be different than in the embodiment shown.

Proceeding from the embodiment shown in FIG. 7, the cooling body may be manufactured as an integral component of the latent heat storage module 104 in which the cooling ribs 128 are formed on the profile sections 140, one rib, for example, extending from one of the peripheral regions of each profile section 140. This embodiment is shown in FIG. 9.

Figure 9:
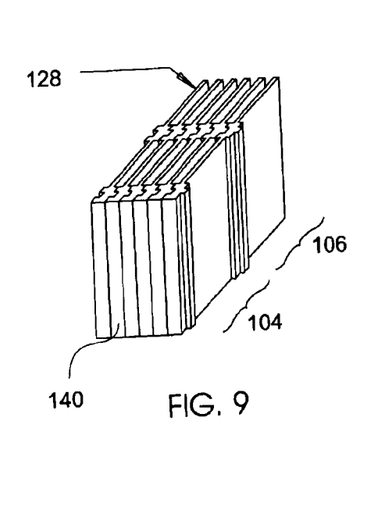
FIG. 9 is a perspective view of a further embodiment of a latent heat storage module with an integrated cooling body.
Figure 10:
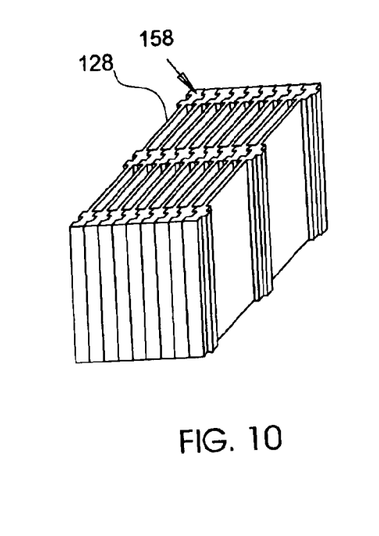
FIG. 10 a is a perspective view of a further embodiment of a latent heat storage module with an integrated cooling body.
Figure 11:
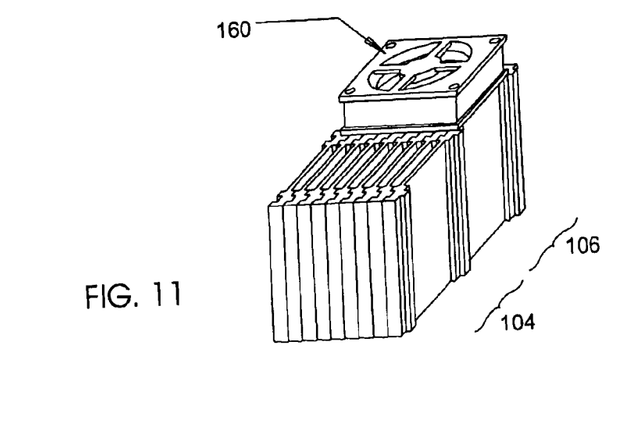
FIG. 11 a perspective view of the latent heat storage module from FIG. 10 with a connected fan.

The structure shown in FIG. 9 may, as shown in FIG. 10, be adapted to the effect that the cooling ribs 128 are closed with an additional peripheral region or tongue and groove section. This arrangement is particularly well-suited for forced cooling by means of a fan or else for the use of a liquid coolant. A structure of this kind with a connected fan 160 is shown in FIG. 11.

With respect to the profile sections 140 of the previously shown embodiments, production of a closed latent heat storage medium container requires that the ceiling and floor plates 136, 138 must be joined on, which implies additional work stages: the plates must be cut and worked; the housing must be closed by soldering or gluing. If the profile sections 140 are manufactured not as extruded profiles but as cast parts, pressed parts, deep-drawn parts or the like, the groove 146 and the tongue 148 may extend fully around the periphery of each profile section 140. This is shown, for example, in FIG. 12 in a sectional view and in FIG. 13 in a perspective view. In this instance, it is no longer necessary to close the latent heat storage module formed by assembling a multiplicity of profile sections 140 using plates 136, 138, because the peripheral groove 146 and tongue 148 serve to close the portions of the latent heat storage module between adjacent profile sections.

Figure 13:
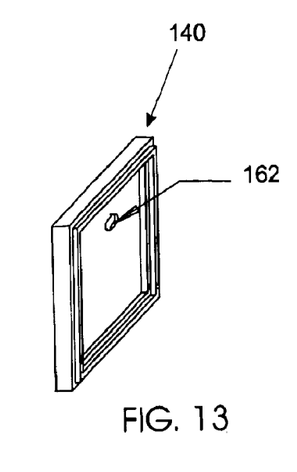
FIG. 13 is a perspective view of the profile section from FIG. 12.

As shown in FIG. 13, the profile sections 140 may have one or more holes 162 which permit filling the spaces between profile sections 150 with the latent heat storage medium.

Figure 14:
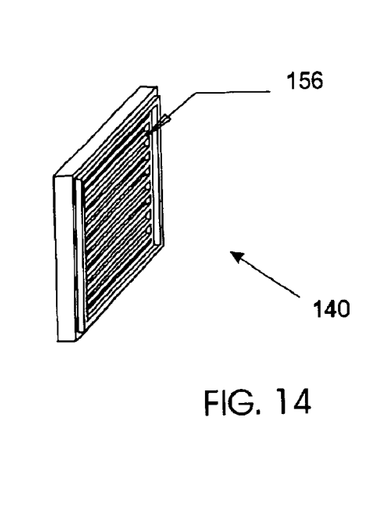
FIG. 14 is a perspective view of a profile section of a latent heat storage module according to a further exemplary embodiment of the present invention.

Similar to the embodiment shown in FIG. 8, these profile sections 140, as shown in FIG. 14, may also have additional rib structures 156 to improve the heat distribution.

Figure 12:
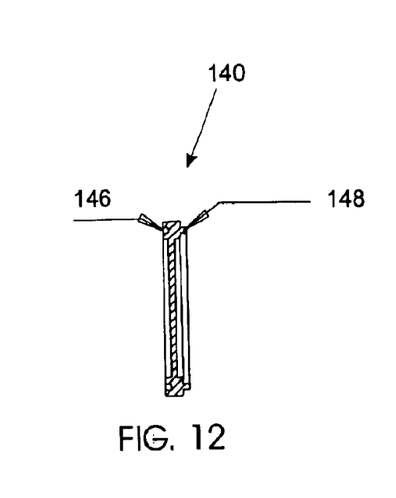
FIG. 12 a section through a profile section of a latent heat storage module according to a further embodiment of the present invention.
Figure 15:
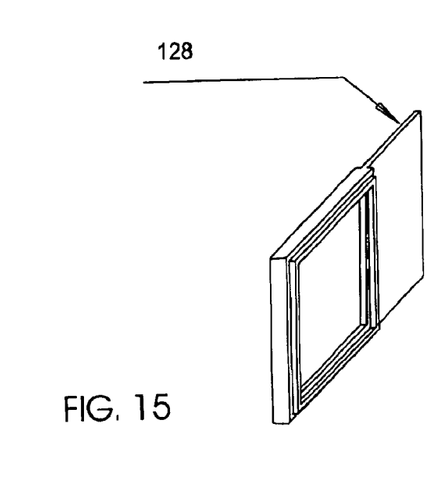
FIG. 15 is a perspective view of a profile section of a latent heat storage module according to a further exemplary embodiment of the present invention.

FIG. 15 shows a profile section 140 according to the embodiment of FIG. 12 with a formed cooling rib 128.

Similar to the embodiment shown in FIGS. 10 and 11, additional second tongue and groove connections 158 may also be provided to connect the cooling ribs 128 with one another. This embodiment is shown in FIG. 16.

Figure 16:
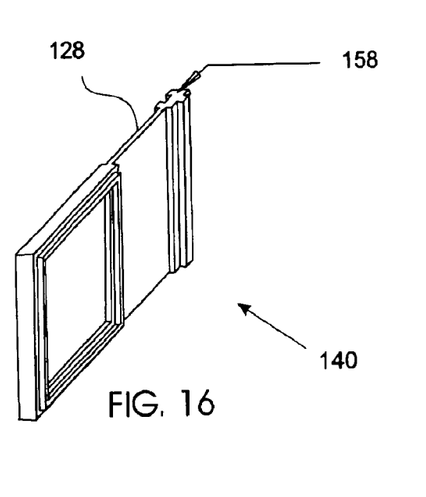
FIG. 16 is a perspective view of a profile section of a latent heat storage module according to a further exemplary embodiment of the present invention.
Figure 17:
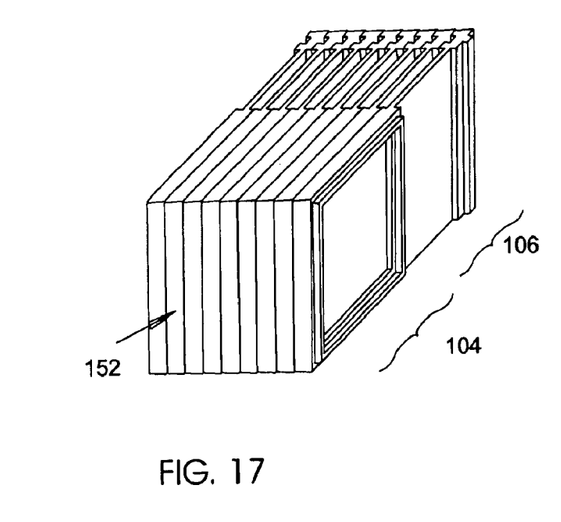
FIG. 17 is a perspective view of an assembled latent heat storage module according to a further embodiment of the present invention.

FIG. 17 shows the arrangement of the latent heat storage module 104 with the integrated cooling body 106 formed from the joined profile sections 140 of FIG. 16 in a perspective view. In this instance, the face 152 designates the substrate mounting face.

Figure 18:
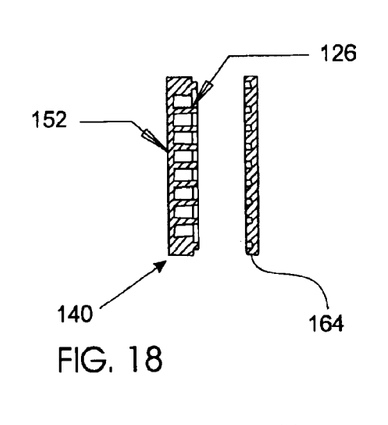
FIG. 18 is a sectional view through a latent heat storage module according to a further exemplary embodiment of the present invention.

The embodiments shown thus far are primarily suited for large latent heat accumulators, as the latent heat storage module may extend below the integrated circuit to a very great depth. However, if such a depth does not have to be reached, it may be sufficient to configure only one profile section 140, which has been manufactured as a cast, pressed or deep-drawn part, as shown in FIG. 18 and to assemble the integrated circuit on the face 152. A cover plate 164, which may also be manufactured as a cast, pressed or deep-drawn part, closes the profile section 140 to the latent heat storage module 104, as shown in FIG. 19.

Figure 19:
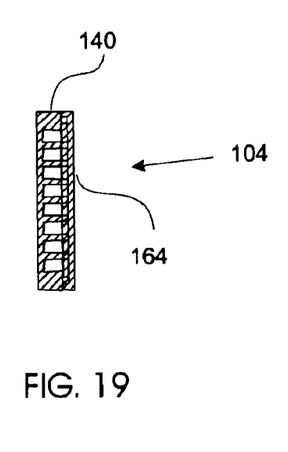
FIG. 19 is a sectional view of the latent heat storage module of FIG. 19 in the assembled state.

In the embodiment shown in FIGS. 18 and 19, the heat-conducting ribs 126, which are formed on the profile section 140, are fitted into corresponding grooves on the ceiling section 164. This rib-groove connection ensures an improved heat flow from the substrate mounting face 152 to the cooling body side.

Figures 20, 21:
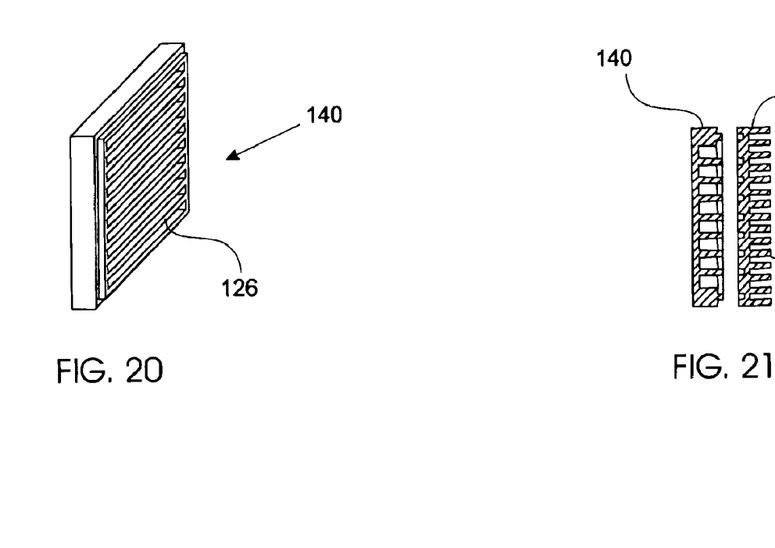
FIG. 20 is a perspective view of the profile section from FIG. 18.
FIG. 21 is another sectional view through the latent heat storage module of FIG. 18.

FIG. 20 shows a perspective view of the profile section 140 according to the embodiment from FIGS. 18 and 19.

As shown in FIG. 21, the ceiling section 164 may also be configured with cooling ribs 128 to form a cooling body.

Figure 22:
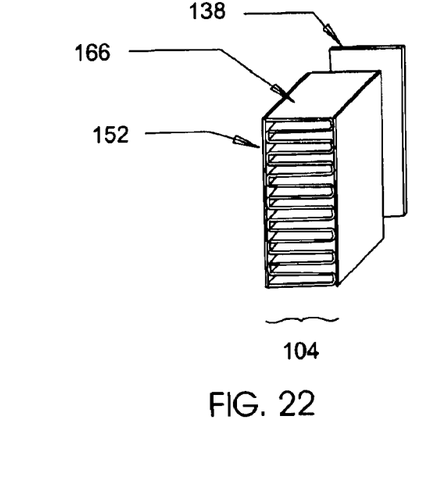
FIG. 22 is a perspective view of a latent heat storage module according to a further embodiment of the present invention.

FIG. 22 shows a further exemplary embodiment of the latent heat storage module 104 according to the invention. Here, the heat-conducting ribs are formed by a folded sheet metal structure 166. A cover 138 closes off the structure towards the cooling body, while the substrate mounting face 152 may remain open, and the latent heat storage module 104 is soldered directly to the substrate to close the latent heat storage module 104.

Figures 23, 24:
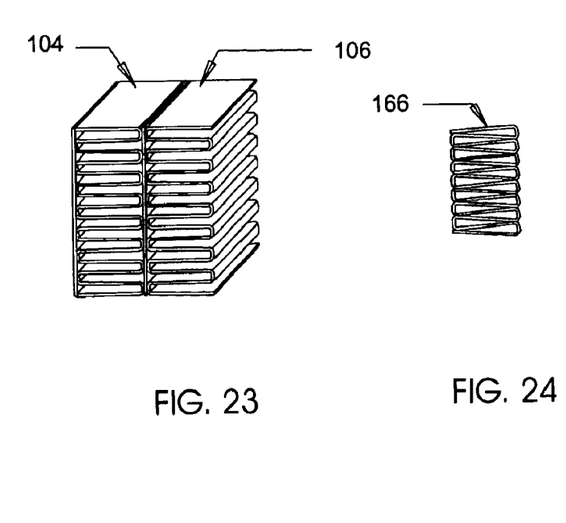
FIG. 23 is a perspective view of a latent heat storage module with an integrated cooling body according to a further embodiment of the present invention.
FIG. 24 is a sectional view through a rib structure of a latent heat storage module according to a further embodiment of the present invention.

A latent heat storage module 104 with an integrated cooling body 106 may be formed from two folded sheet metal plates, as shown in perspective in FIG. 23. The surface may be further enlarged by compressed ribs 166, as shown in FIG. 24, or by any other rib forms.

Figure 25:
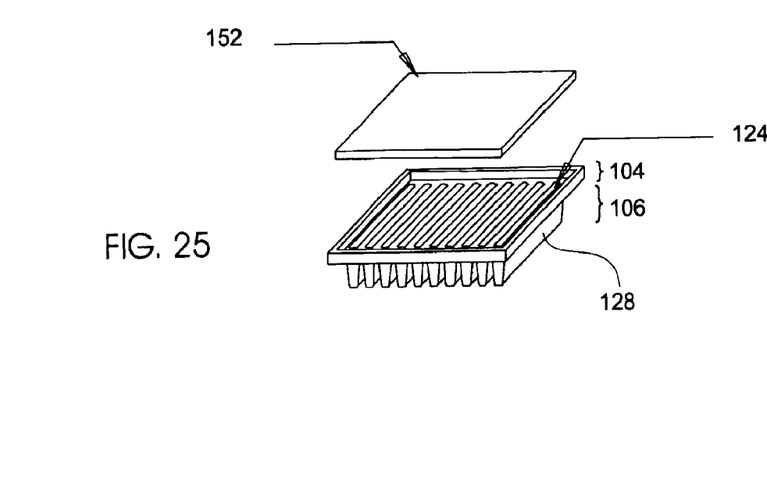
FIG. 25 a an exploded perspective view of a latent heat storage module according to a further embodiment of the present invention.

According to a further exemplary embodiment of the invention, the latent heat storage module 104 and the cooling body 106 are configured as one piece and the latent heat storage medium is located in the hollow cooling ribs 128. A cover, which closes the arrangement, serves simultaneously as a substrate mounting face 152 or the closure of the latent heat storage module may be formed completely by the substrate.

Figure 26:
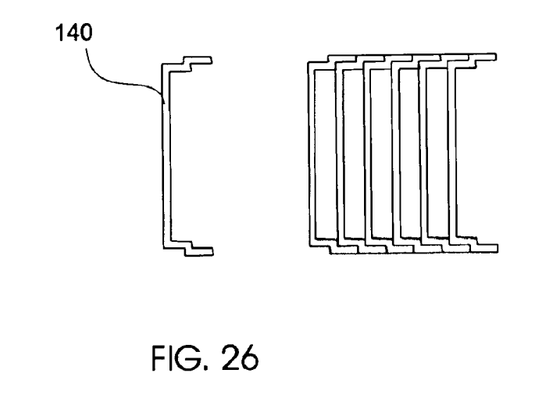
FIG. 26 is a sectional view of a latent heat storage module according to a further embodiment of the present invention.
Figure 27:
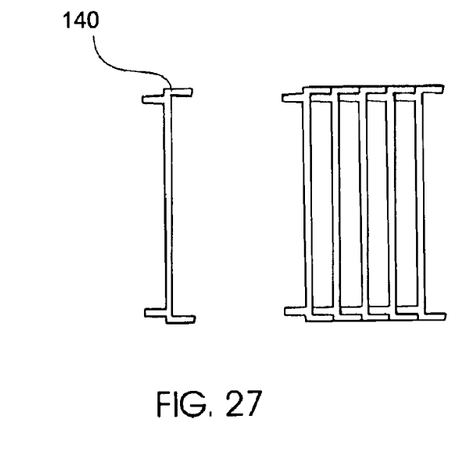
FIG. 27 is a sectional view of a latent heat storage module according to a further embodiment of the present invention.

As shown as examples in FIGS. 26 and 27, the connection of the profile elements to one another must not compulsorily be performed by means of grooves and tongues, but may be performed by any other joining processes.

Figure 28:
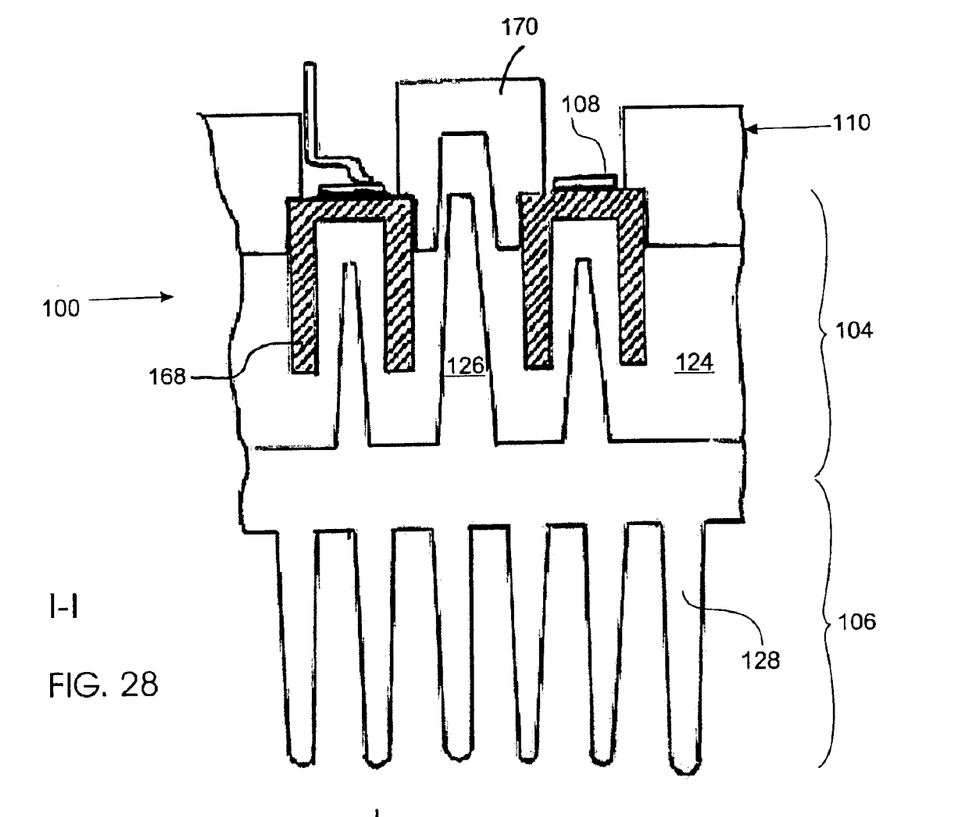
FIG. 28 a sectional view, along the intersection line I—I from FIG. 29, through the integrated circuit system shown in FIG. 29.
Figure 29:
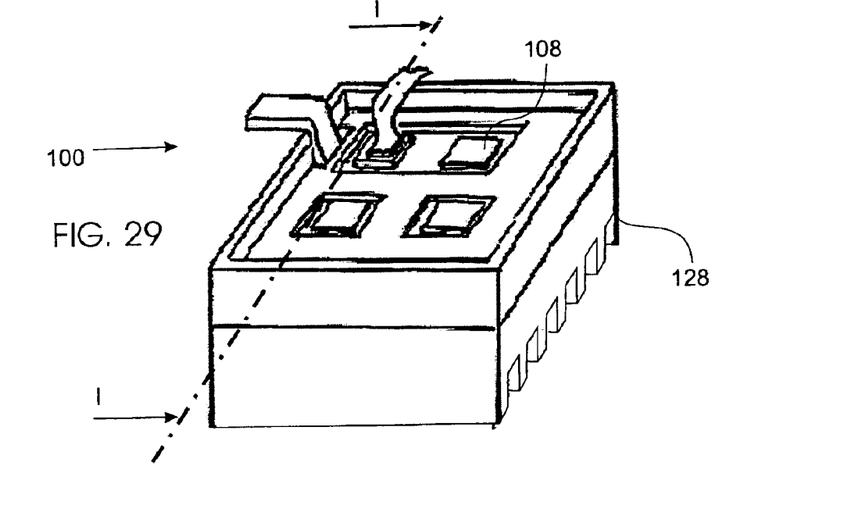
FIG. 29 is a perspective view of an integrated circuit system according to a further embodiment of the present invention.

FIGS. 28 and 29 show an integrated circuit system 100 in a further fully-integrated embodiment. As shown in a sectional view in FIG. 28, in this embodiment, the substrate 110 is formed by electrically conductive thermal coupling elements 168 which are embedded in an electrically insulating plastic frame 170. At least one semiconductor component 108 is mounted on the thermal coupling elements 168 in each case. This may be performed by soldering, gluing or pressing techniques.

Comparable with small islands, the thermal coupling elements 168 are immersed directly into the latent heat storage medium 124 and, in this way, directly convey the heat generated by the semiconductor components 108 to the heat storage medium 124. The thermal coupling elements 168 may be manufactured from metal, preferably copper, by pressing and bending, for example. In this instance, the frame 170 ensures both a mechanical fixing as well as an electrical insulation of the thermal coupling elements 168. With respect to the embodiment shown, the substrate 110 directly forms one wall of the latent heat storage module 104. A further wall is formed by the cooling body 106. In addition to the cooling ribs 128, which ensure the heat transmission to the environment, heat-conducting ribs 126 are formed on the cooling body 106 which permit a heat distribution in the interior of the latent heat storage module 104.

With respect to the embodiment shown, the thermal coupling elements 168 realise both the electrical bulk bonding of the semiconductor components 108 as well as their thermal coupling to the latent heat storage medium 124. For each different voltage potential at the underside of the electrical components 108, i.e. the bulk, a separate thermal coupling element 168 insulated from the other elements is required. With respect to this embodiment, the latent heat storage medium 124 has electrically insulating properties. Here, the electrical bonding of the upper side of the semiconductor component 108 may be performed by means of wire-bonding techniques, joining techniques or pressing techniques. FIG. 29 shows a perspective view of an integrated arrangement of this kind.

The highly-integrated solution shown in FIGS. 28 and 29 has the advantage that expensive power substrates are no longer required. Furthermore, the thermal resistance of the insulating substrate, which is a ceramic layer in the embodiments with the DCB substrate, is avoided. Especially in applications which deliver only a short-duration but nevertheless very high power dissipation in particular, significantly higher peak loads may thus be permitted. Furthermore, because joining techniques such as soldering on a copper plate are not required, this embodiment may offer a high load and thermal fatigue resistance. Thus, this embodiment may be advantageously used for soft-start devices to induce electric motors, frequency converters for highly dynamic servomotors in drive technology as well as for starter generator converters in the automobile industry.

What is claimed is:

1. An integrated circuit system comprising:
    at least one integrated circuit having a substrate with at least one semiconductor component assembled on the substrate the substrate being a direct copper bonding substrate which is formed by a ceramic structure coated at least partially with copper on the front and rear side thereof;
    a cooling body configured to dissipate heat generated by the integrated circuit; and
    a latent heat storage module having a latent heat storage medium which is thermally connected to the cooling body to temporarily store the heat generated by the integrated circuit and to convey it to the cooling body, the substrate being in direct thermal contact with the latent heat storage module.

2. An integrated circuit system according to claim 1, wherein the substrate is mechanically fixed to the latent heat storage module by a material-joining connection.

3. An integrated circuit system according to claim 2, wherein the material-joining connection is formed by soldering, welding or gluing.

4. An integrated circuit system according to claim 1, wherein the latent heat storage module has a latent heat storage housing which forms a hollow body filled with the latent heat storage medium.

5. An integrated circuit system according to claim 1, wherein the latent heat storage housing includes a wall in thermal contact with the pooling body and at least partially formed by the cooling body.

6. An integrated circuit system according to claim 1, wherein the semiconductor component is connected to the substrate by a soldered connection.

7. An integrated circuit system according to claim 1, wherein the semiconductor component is connected to the substrate by a glued connection.

8. An integrated circuit system according to claim 1, wherein the latent heat storage medium is paraffin.

9. An integrated circuit system according to claim 1, wherein the cooling body has at least one cooling rib for conveyance of heat.

10. An integrated circuit system according to claim 1, wherein the cooling body is connectable to a cooling circuit.

* * * * *

UNITED STATES PATENT AND TRADEMARK OFFICE
CERTIFICATE OF CORRECTION

PATENT NO. : 6,963,131 B2
DATED : November 8, 2005
INVENTOR(S) : Frisch et al.

It is certified that error appears in the above-identified patent and that said Letters Patent is hereby corrected as shown below:

Column 10,
Line 52, "contact with the pooling" should read -- contact with the cooling --.

Signed and Sealed this

Twenty-first Day of February, 2006

JON W. DUDAS
*Director of the United States Patent and Trademark Office*